(12) United States Patent
Tanishima et al.

(10) Patent No.: US 9,216,731 B2
(45) Date of Patent: Dec. 22, 2015

(54) CONTROL DEVICE FOR HYBRID VEHICLE

(75) Inventors: Kaori Tanishima, Isehara (JP); Hiroaki Kawamura, Sagamihara (JP); Kenichiro Gunji, Hadano (JP)

(73) Assignee: NISSAN MOTOR CO., LTD., Yokohama-shi, Kanagawa (JP)

(*) Notice: Subject to any disclaimer, the term of this patent is extended or adjusted under 35 U.S.C. 154(b) by 0 days.

(21) Appl. No.: 14/127,023

(22) PCT Filed: Jun. 19, 2012

(86) PCT No.: PCT/JP2012/065577
§ 371 (c)(1),
(2), (4) Date: Dec. 17, 2013

(87) PCT Pub. No.: WO2013/002062
PCT Pub. Date: Jan. 3, 2013

(65) Prior Publication Data
US 2014/0136039 A1  May 15, 2014

(30) Foreign Application Priority Data

Jun. 30, 2011 (JP) .................................. 2011-145127

(51) Int. Cl.
*B60W 20/00* (2006.01)
*B60W 10/02* (2006.01)
*B60W 10/06* (2006.01)
*B60W 10/08* (2006.01)
(Continued)

(52) U.S. Cl.
CPC ................. *B60W 20/00* (2013.01); *B60K 6/48* (2013.01); *B60L 11/14* (2013.01); *B60L 15/2054* (2013.01); *B60W 10/02* (2013.01); *B60W 10/06* (2013.01); *B60W 10/08* (2013.01); *B60W 20/40* (2013.01); *F02D 29/02* (2013.01); *F02N 11/0818* (2013.01); *B60K 2006/4825* (2013.01); *B60L 2210/40* (2013.01); *B60L 2240/12* (2013.01); *B60L 2240/421* (2013.01); *B60L 2240/423* (2013.01); *B60L 2240/441* (2013.01); *B60L 2240/443* (2013.01); *B60L 2240/486* (2013.01); *B60L 2240/507* (2013.01); *B60W 2510/083* (2013.01); *B60W 2520/10* (2013.01); *F02N 11/04* (2013.01); *F02N 2300/2011* (2013.01); *Y02T 10/48* (2013.01); *Y02T 10/6221* (2013.01); *Y02T 10/6252* (2013.01); *Y02T 10/6286* (2013.01); *Y10S 903/903* (2013.01)

(58) Field of Classification Search
None
See application file for complete search history.

(56) References Cited

U.S. PATENT DOCUMENTS 6,077,186 A * 6/2000 Kojima et al. .................... 477/3
6,253,127 B1 * 6/2001 Itoyama et al. ................. 701/22
(Continued)

FOREIGN PATENT DOCUMENTS

CN   1962335 A    5/2007
JP   3116685 B2   12/2000
(Continued)

*Primary Examiner* — Rami Khatib
*Assistant Examiner* — Navid Ziaeianmehdizadeh
(74) *Attorney, Agent, or Firm* — Young Basile

(57) ABSTRACT

Provided is a control system for a hybrid vehicle capable of achieving engine startup while minimizing shock. In the control system for a hybrid vehicle, in response to an engine startup request, upon engagement of a clutch between a motor generator and a drive wheel and startup of the engine by the motor generator, engine startup is allowed when the engine startup request is present and the absolute value of the motor/generator output torque assumes a predetermined value or less.

8 Claims, 6 Drawing Sheets

(51) Int. Cl.

| | | |
|---|---|---|
| *B60K 6/48* | (2007.10) | |
| *F02D 29/02* | (2006.01) | |
| *F02N 11/08* | (2006.01) | |
| *B60L 11/14* | (2006.01) | |
| *B60L 15/20* | (2006.01) | |
| *F02N 11/04* | (2006.01) | |

(56) References Cited

U.S. PATENT DOCUMENTS

| | | | |
|---|---|---|---|
| 6,823,954 B2 * | 11/2004 | Shimabukuro et al. | 180/65.25 |
| 7,770,678 B2 | 8/2010 | Nozaki et al. | |
| 8,387,730 B2 * | 3/2013 | Bouchon | 180/65.265 |
| 8,565,990 B2 * | 10/2013 | Ortmann et al. | 701/67 |
| 8,594,913 B2 * | 11/2013 | Steuernagel | 701/113 |
| 8,731,753 B2 * | 5/2014 | Smith et al. | 701/22 |
| 8,874,289 B2 * | 10/2014 | Tanba et al. | 701/22 |
| 2005/0121239 A1 * | 6/2005 | Tsuneyoshi et al. | 180/65.2 |
| 2007/0102211 A1 * | 5/2007 | Nozaki et al. | 180/65.7 |
| 2007/0227790 A1 * | 10/2007 | Tanishima | 180/65.2 |
| 2008/0302324 A1 * | 12/2008 | Aswani et al. | 123/179.3 |
| 2011/0112708 A1 * | 5/2011 | Fassnacht | 701/22 |
| 2013/0218389 A1 * | 8/2013 | Tanishima et al. | 701/22 |

FOREIGN PATENT DOCUMENTS

| | | |
|---|---|---|
| JP | 2001304008 A | 10/2001 |
| JP | 2005232993 A | 9/2005 |
| JP | 2008265615 A | 11/2008 |
| JP | 2009149213 A | 7/2009 |
| JP | 2010143296 A | 7/2010 |
| JP | 2010202151 A | 9/2010 |
| JP | 2010234923 A | 10/2010 |
| JP | 2010255504 A | 11/2010 |

* cited by examiner

CONTROL DEVICE FOR HYBRID VEHICLE

CROSS REFERENCE TO RELATED APPLICATION

The present application claims priority to Japanese Patent Application No. 2011-145127, filed Jun. 30, 2011, incorporated herein in its entirety.

TECHNICAL FIELD

This invention relates generally to a control system for a hybrid vehicle that is arranged to start an engine by engaging an engagement element between the engine and a motor.

BACKGROUND ART

As a control system for a hybrid vehicle, a technique is disclosed in JP Patent No. 3,116,685 in which an engine start operation is allowed by a motor/generator during a deceleration while driven by an electric motor when an engine start command issues and a sufficient braking amount of braking is confirmed.

However, even if the braking force is secured, when the engine is started with a creeping torque being input, torque fluctuations occur associated with the engine start so that a shock is likely to generate. The present invention has been created while focusing on the problem described above and aims to provide a control device that can attain an engine start with the shock being suppressed.

BRIEF SUMMARY

In order to solve the above objective, in a control system for a hybrid vehicle according to the present invention, when an engine start request is made to start the engine by a motor/generator by engaging a clutch between the motor/generator and a driving wheel, the engine start is allowed upon the presence of the engine start request and the absolute value of the torque of the motor/generator is equal to or less than a predetermined value being detected. Therefore, torque fluctuations associated with an engine start may be suppressed so that discomfort felt by the driver may be alleviated.

BRIEF DESCRIPTION OF THE DRAWINGS

The description herein makes reference to the accompanying drawings wherein like reference numerals refer to like parts throughout the several views, and wherein.

DETAILED DESCRIPTION OF THE EMBODIMENTS

Figure 1:
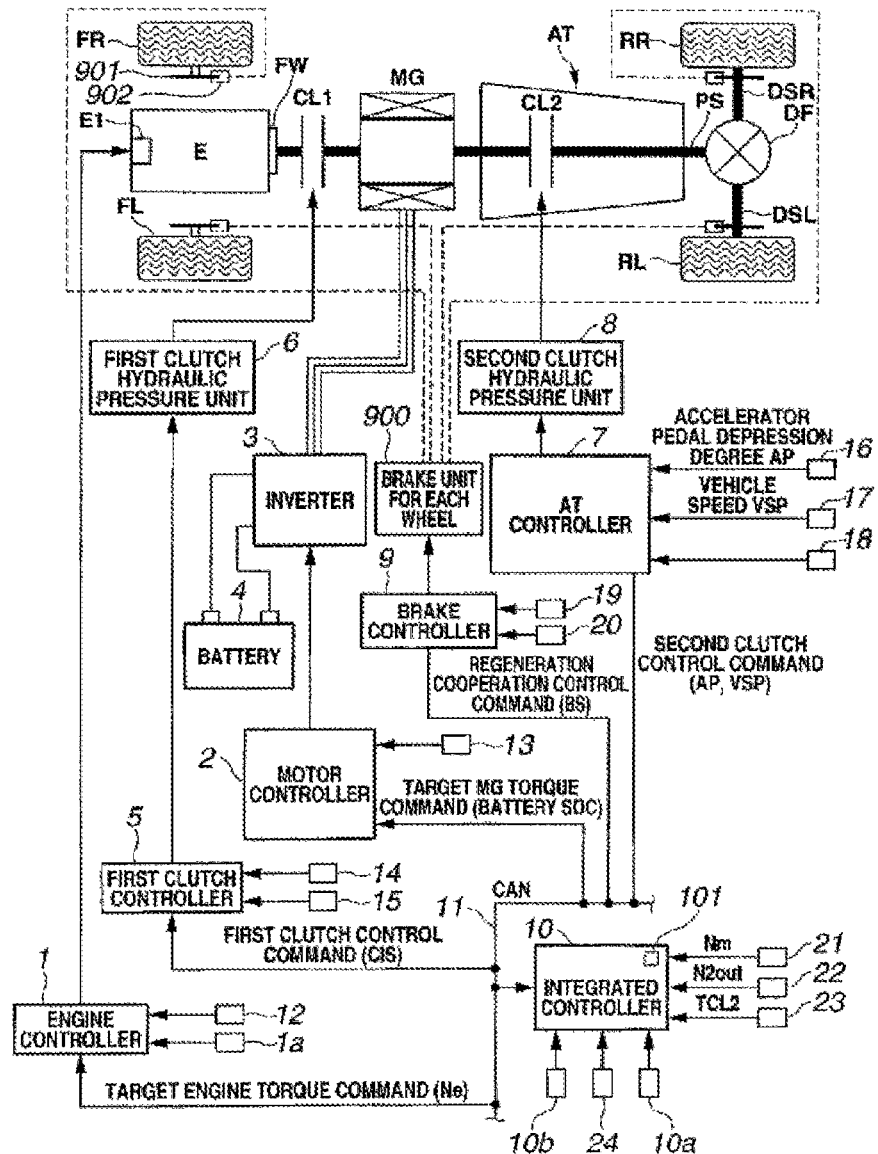
FIG. 1 is an illustration showing a rear-wheel driving hybrid vehicle incorporating a traction control system of a first embodiment.

First, an arrangement of a driving system of a hybrid vehicle is discussed. As shown in FIG. 1, a driving system of the hybrid vehicle includes an engine E, a first clutch CL1 (engine clutch), a motor generator MG, a second clutch CL2 (starting clutch), an automatic transmission AT, a propeller shaft PS, a differential DF, a left drive shaft DSL, a right drive shaft DSR, a left rear wheel RL (driving wheel) and a right rear wheel RR (driving wheel). FL denotes a left front wheel, and FR denotes a right front wheel.

Engine E is, for example, a gasoline-fueled engine in which the valve position of a throttle valve and the like are controlled based on control commands from an engine controller 1. An engine power output shaft is provided with a flywheel FW.

First clutch CL1 is a clutch interposed between engine E and motor generator MG and serves as an engine clutch. The engagement and disengagement of the first clutch CL1 is controlled by a control hydraulic pressure produced by a first clutch hydraulic pressure unit 6 based on a control command from a first clutch controller 5.

Motor generator MG is a synchronous motor generator having a rotor in which a permanent magnet is embedded and a stator on which a stator coil is wound. The motor generator MG is controlled by being impressed with a three phase alternating current, which is produced by an inverter 3 based on a control command from a motor controller 2. This motor generator MG acts as an electric motor that rotates upon being supplied with electric power from a battery 4 (this condition is hereinafter refers to as "powering") and can also function as a generator to generate an electromotive force at opposite ends of the stator coil when the rotor is rotated by an external force to charge the battery 4 (this condition is hereinafter referred to as "regeneration"). The rotor of this motor generator MG is connected to a power input shaft of automotive transmission AT through a damper (not shown).

Second clutch CL2 is a clutch interposed between motor generator MG and left and right rear wheels RL, RR and serves as a starting clutch. The engagement and disengagement, including a slip engagement, of the clutch are controlled by a control hydraulic pressure produced by a second clutch unit 8 based on a control command from an AT controller 7 as discussed hereinafter.

Automatic transmission AT is a transmission in which staged transmission ratios (gear ratios) such as forward five-speeds and reverse one-speed or the like are automatically changed according to a vehicle speed, an accelerator pedal depression degree and the like. Second clutch CL2 is not necessarily a separate clutch for exclusive use as the second clutch CL2. Instead, some friction clutch elements of a plurality of such elements to be engaged at each gear-stage (gear ratio) of automatic transmission AT may serve as the second clutch CL2.

The power output shaft of automatic transmission AT is connected to left and right rear wheels RL, RR through propeller shaft PS, differential DF, left drive shaft DSL and right drive shaft DSR. A multi-plate wet clutch whose hydraulic fluid flow quantity and hydraulic pressure can be continuously controlled, for example, by a proportional solenoid is used as the first clutch CL1 and second clutch CL2.

The brake unit 900 comprises a hydraulic pump, a plurality of electromagnetic valves, and is configured to permit a so-called brake-by-wire control in which a hydraulic pressure corresponding to a required braking torque is ensured by a pump pressure increase and a wheel cylinder pressure is controlled by controlling to selective opening and close a solenoid valve for each wheel. Each wheel FL, FR, RR, RL is provided with a brake rotor 901 and a caliper 902 for generating a friction braking torque by a hydraulic pressure supplied from a brake unit 900. Note that R, FL, RR, the RL, the caliper 902 and brake rotor 901 is provided to generate a frictional braking torque due to the brake fluid pressure supplied from the brake unit 900. It may also be of a type having an accumulator such as a hydraulic pressure source, or may be configured with an electric caliper instead of the hydraulic brake.

This hybrid driving system has three drive modes according to the engaged and disengaged states of first clutch CL1 and second clutch CL2. A first drive mode is an electric drive mode (hereinafter referred to as "EV mode") in which drive is made using only the power of motor generator MG as a power source under the disengaged state of first clutch CL1. A second drive mode is an engine-using drive mode (hereinafter referred to as "HEY mode") in which drive is made by a power source including engine E upon the engaged state of first clutch CL1. A third drive mode is an engine-using slip drive mode (hereinafter referred to as "WSC mode") in which drive is made by a power source including engine E upon making a slip control of second clutch CL2 in the engaged state of first clutch CL1. This mode can accomplish a creep drive particularly when a battery SOC is low or when an engine coolant temperature is low. When transition is made from the EV mode to the HEV mode, first clutch CL1 is engaged to allow starting of the engine E by using the torque of motor generator MG.

The HEV mode further includes three drive modes such as an engine drive mode, a motor assist drive mode and a drive power generation mode.

In the engine drive mode, the driving wheels are driven by using only engine E as a power source. In the motor assist drive mode, the driving wheels are driven by using engine E and motor generator MG as power sources. In the drive power generation mode, the driving wheels RR, RL are driven by using engine E as a power source while motor generator MG is simultaneously caused to function as an electric generator to charge the battery 4.

During steady speed driving and accelerated speed driving, motor generator MG is operated as an electric generator by using the power of engine E to charge the battery 4. Additionally, during decelerated speed driving, braking energy is regenerated so as to make electric generation by motor generator MG, thereby being used for charging battery 4. Finally, electric power generation mode occurs when motor generator MG is operated as an electric generator while stopping the vehicle.

Now, description is given of the control system of the hybrid vehicle. As shown in FIG. 1, a control system of the hybrid vehicle is arranged including engine controller 1, motor controller 2, inverter 3, battery 4, first clutch controller 5, first clutch hydraulic pressure unit 6, AT controller 7, second clutch hydraulic pressure unit 8, brake controller 9 and integrated controller 10. Engine controller 1, motor controller 2, first clutch controller 5, AT controller 7, brake controller 9 and integrated controller 10 are connected with each other through a CAN communication line 11, which makes information exchange possible among them.

Engine speed information from engine speed sensor 12 is input to engine controller 1, which outputs a command for controlling an engine operating point (Ne: engine speed, Te: engine torque) to, for example, a throttle valve actuator E1 in accordance with a target engine torque command and the like from integrated controller 10. The more detailed content of the engine control will follow. Note that information such as engine speed Ne and the like is supplied through CAN communication line 11 to integrated controller 10.

Information from a resolver 13 that detects the rotational position of a rotor of motor generator MG is input to motor controller 2, which outputs to inverter 3 a command for controlling the motor operating point (Nm: motor generator rotational speed, Tm: motor generator torque) of motor generator MG according to a target motor generator torque command and the like from integrated controller 10. This motor controller 2 monitors a state of charge SOC of battery 4. The SOC is used as control information for motor generator MG and is supplied to integrated controller 10 through CAN communication line 11.

Sensor information from first clutch hydraulic pressure sensor 14 and first clutch stroke sensor 15 are input to first clutch controller 5, which outputs a command for controlling the engagement and disengagement of first clutch CL1 according to a first clutch control command from integrated controller 10 to first clutch hydraulic pressure unit 6. The information of a first clutch stroke CIS is supplied to integrated controller 10 through CAN communication line 11.

Sensor information from an inhibitor switch for outputting a signal according to the signals of accelerator position sensor 16, vehicle speed sensor 17, second clutch hydraulic pressure sensor 18 and the signal according to a shift lever operated by a driver is input to AT controller. The AT controller outputs a command for controlling the engagement and disengagement of second clutch CL2 according to the second clutch control command from integrated controller 10 to second clutch hydraulic pressure unit 8 in an AT hydraulic pressure control valve. An accelerator pedal depression degree APO, a vehicle speed VSP and the information of the inhibitor switch are supplied to integrated controller 10 through CAN communication line 11.

Brake controller 9 outputs a command for controlling brake actuators 902 of the four wheels to respective brake units 900 of the four wheels, thereby controlling the braking force of each of the four wheels. Sensor information from the wheel speed sensor 19 for detecting the wheel speed of each of the four wheels and brake stroke sensor 20 are input to brake controller 9. When a required braking force obtained according to a brake stroke BS is insufficient with only the regeneration braking force during braking by depressing a brake pedal, regeneration cooperation brake control is made according to a regeneration cooperation control command from integrated controller 10 in order to compensate for the insufficient amount with a mechanical braking force (braking force due to friction brake). Needless to say, the hydraulic pressure may be generated arbitrarily by other control command, i.e. not limited to a brake hydraulic pressure in accordance with a driver commanded braking torque.

Integrated controller 10 controls the consumed energy of the whole vehicle and functions to drive the vehicle with the highest efficiency. To the integrated controller, information from a motor rotational speed sensor 21 for detecting a motor rotational speed Nm, a second clutch output rotational speed sensor 22 for detecting a second clutch output rotational speed N2out, a second clutch torque sensor 23 for detecting a second clutch transmission torque capacity TCL2, a brake hydraulic pressure sensor 24, a temperature sensor 10a for detecting the temperature of second clutch CL2, information from an acceleration sensor (G sensor) 10b for detecting forward and backward acceleration and information obtained through CAN communication line 11 are input.

Additionally, integrated controller 10 accomplishes operation control of engine E by the control command to engine controller 1, operation control of motor generator MG by the control command to motor controller 2, engagement and disengagement control of first clutch CL1 by the control command to first clutch controller 5, and engagement and disengagement control of second clutch CL2 by the control command to AT controller 7.

Figure 2:
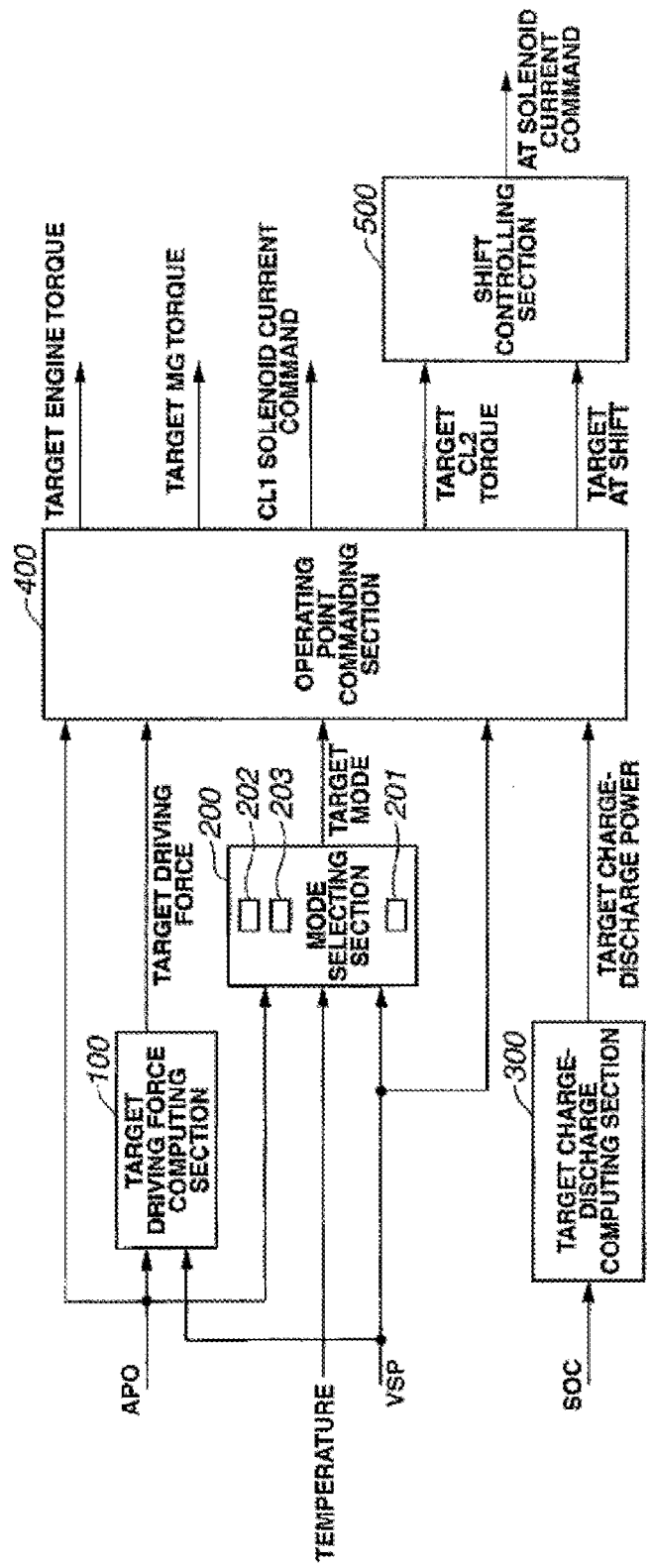
FIG. 2 is a control block diagram showing a computing program in an integrated controller in the first embodiment.

Hereinafter, a control computed by integrated controller 10 of the first embodiment is discussed with reference to a block diagram shown in FIG. 2. For example, this computation is carried out every 10 msec. control period by integrated controller 10. Integrated controller 10 includes a target driving force computing section 100, a mode selecting section 200, a target charge-discharge computing section 300, an operating point commanding section 400 and a shift controlling section 500.

Figure 3:
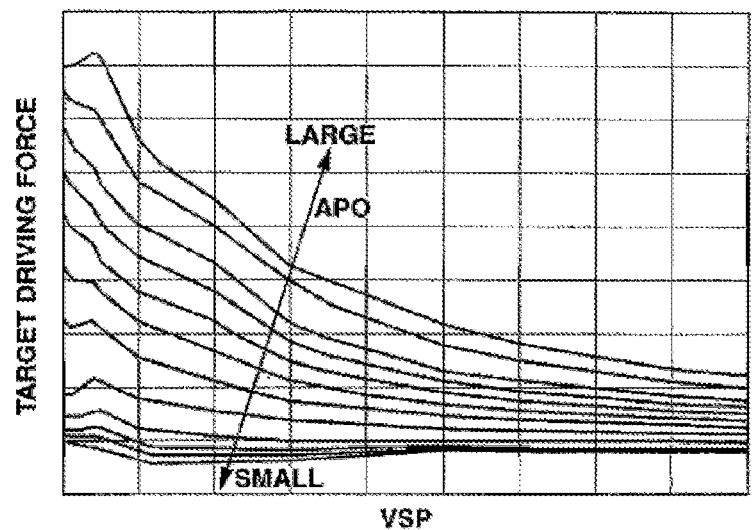
FIG. 3 is a diagram showing an example of a target driving force map used for a target driving force computation in a target driving force computing section in FIG. 2.

In target driving force computing section 100, a target driving force tFoO is computed according to accelerator pedal depression degree APO and vehicle speed VSP by using a target driving force map such as that shown in FIG. 3.

Figure 4:
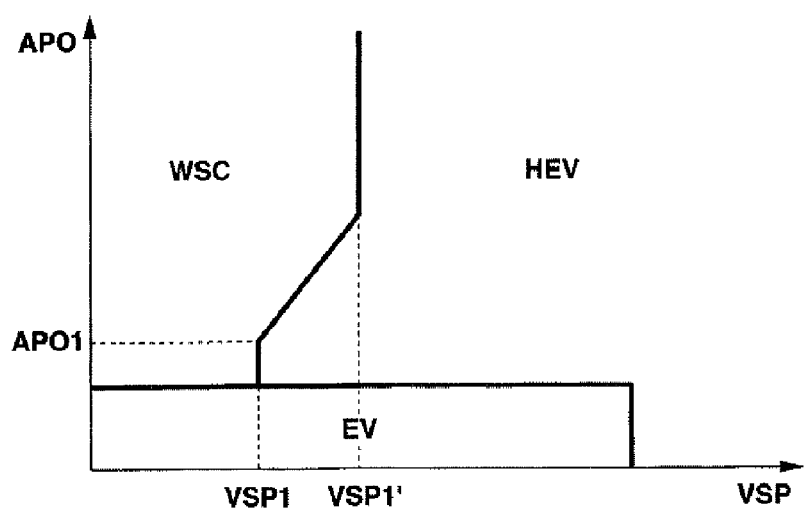
FIG. 4 is a diagram showing a normal mode map used for selecting a target mode in a mode selecting section in FIG. 2.

In mode selecting section 200, a drive mode is selected based on the vehicle speed and accelerator pedal depression degree APO by using a mode map such as the normal mode map shown in FIG. 4. The normal mode map contains therein the EV mode, the WSC mode and the HEV mode, in which a target mode is computed according to accelerator pedal depression degree APO and vehicle speed VSP. However, even where the EV mode is selected, the HEV mode or the WSC mode is compulsorily employed as the target mode if battery SOC is not higher than a certain value.

In the normal mode map of FIG. 4, a changeover line HEV→WSC is set in a region lower than a lower limit value vehicle speed VSP1 at which the engine speed is lower than the idling speed of engine E when automatic transmission AT is in first speed stage (gear-stage) and in a region smaller than the certain accelerator depression degree APO1. In a region greater than the certain accelerator depression degree APO1, a larger driving force is required, and therefore the WSC mode is set also in a high vehicle speed VSP1' region higher than the lower limit vehicle speed VSP1. When the EV mode cannot be accomplished because the battery SOC is lower, the WSC mode is selected even during vehicle starting or the like in the configuration.

When the accelerator pedal depression degree APO is larger, the engine torque corresponding to the engine speed near the idling speed and the torque of motor generator MG have difficulty meeting the torque requirements for mode switching. Here, concerning engine torque, more torque can be outputted as the engine speed rises. From this, if more torque is outputted by raising the engine speed, transition from the WSC mode to the HEV mode can be accomplished within a short period of time even if the WSC mode is carried out in a vehicle speed region reaching to a vehicle speed higher than the lower limit vehicle speed VSP1. This case corresponds to a WSC region extending to the lower limit vehicle speed VSP1' as shown in FIG. 4.

Figure 5:
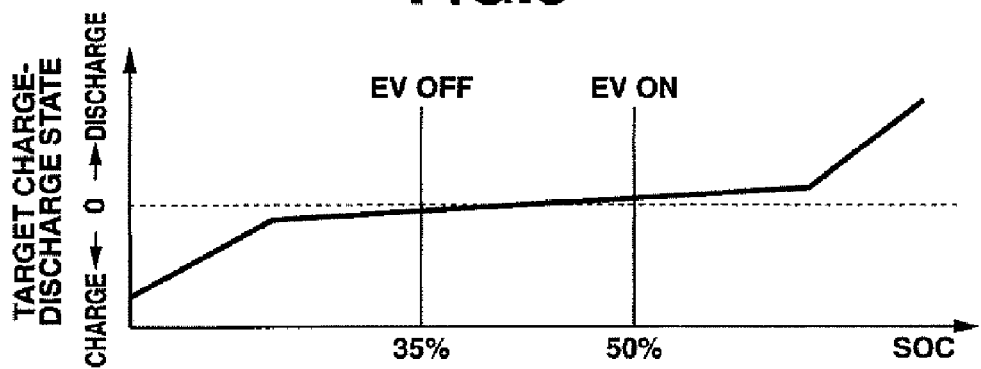
FIG. 5 is a diagram showing an example of a target charge-discharge quantity map used for a computation of a target charge-discharge power in a target charge-discharge computing section in FIG. 2.

In target charge-discharge computing section 300, a target charge-discharge power tP is computed from battery SOC by using a target charge-discharge quantity map such as shown in FIG. 5.

When SOC≥50%, the EV mode region is present in the normal mode map as shown in FIG. 4. If the EV mode region once appears in the mode map, this region continues to appear until SOC lowers below 35%.

When SOC<35%, the EV mode region is absent from the normal mode map of FIG. 5. If the EV mode region is absent from the normal mode map, this region continues to be absent until SOC reaches 50%.

In operating point commanding section 400, a transitional target engine torque, a target motor generator torque, a target second clutch transmission torque capacity, a target gear-stage of automatic transmission AT and a first clutch solenoid current command are computed as operating point targets from acceleration pedal depression degree APO, target driving force tFoO, the target mode, vehicle speed VSP and target charge-discharge power tP. Additionally, operating point commanding section 400 is provided with an engine starting controlling section for starting engine E when the transition from the EV mode to the HEV mode is made.

In an engine start control in the first embodiment, a case or mode in which an engine E is started from a stopped state as a result of the accelerator pedal operation of the driver is referred to as a first start-up mode while the other case or mode in which the engine E is started from a stopped state in response to a cause other than the actor the accelerator pedal operation of the driver (system required or initiated start-up) will be referred to as a second start-up mode.

Now, description is made about the process that executes the second start-up mode. With the engine being stopped, when, any one of the system startup requests listed below is determined to be satisfied, for example, regardless of the accelerator pedal operation of the driver, the engine start request will be determined to be an engine start-up request in the second starting mode.

(1) Performing the engine start in the second starting mode when the oil temperature of the automatic transmission AT reached a predetermined temperature (115° C. or higher, for example).

(2) Performing the engine start in the second starting mode when the oil temperature of the automatic transmission AT falls below a predetermined temperature set in advance (15° C. or less, for example). For example, when the hybrid vehicle is to perform a so-called idle stop at an intersection or the like, this is to prevent excessive decrease of the oil temperature of the automatic transmission AT due to an idling operation for a long time.

(3) Performing the engine start in the second starting mode when the cooling water temperature of the Engine E exceeds a predetermined temperature or set in advance (120° C. or higher, for example).

(4) Performing the start of the engine E in the second starting mode when the cooling water temperature the engine E falls below a predetermined temperature below set in advance (40° C. or less, for example). For example, when the hybrid vehicle is to perform a so-called idle stop at an intersection or the like, this is to prevent the engine E from being placed in a cold state due to an idling for a long time.

(5) Performing the start of the engine E in the second starting mode when the output torque available with the motor/generator MG falls below a predetermined torque set in advance (e.g., 100 Nm or below). This arrangement is provided because there is a possibility that, due to overheating of the motor/generator MG, the motor torque that can be output from the motor/generator MG is lower than the predetermined torque so that the engine 1 may not be started by the motor/generator MG.

Figure 6:
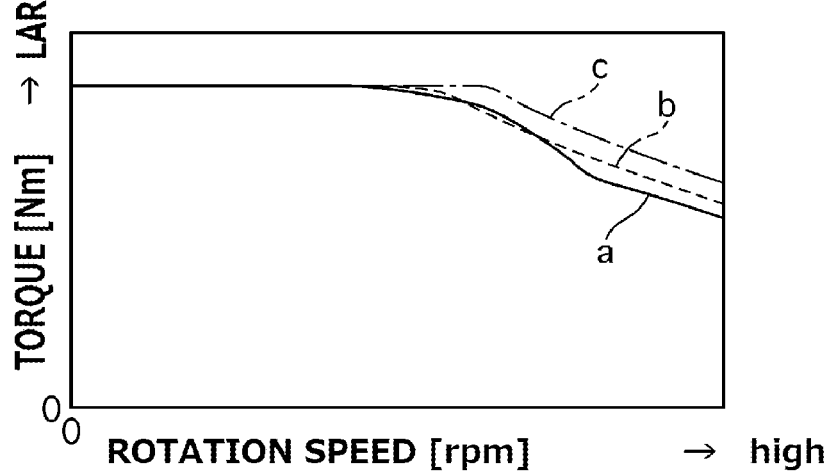
FIG. 6 is a characteristic diagram showing the relationship between a rotation speed of the motor/generator and torque.

(6) Performing the engine start in the second start-up mode when a potential power output of the battery 4 falls below a predetermined power set in advance (20 kw or below, for example). FIG. 6 is a characteristic diagram showing a relationship between the speed of the motor generator in the first embodiment and torque. Due to temperature rise of the battery 4 or by temperature drop of the battery 4, when the potential power output is reduced from the battery 4, as the rotational speed increases as shown in FIG. 6, the motor torque that can be output by the motor generator MG is lowered. Thus, in the case where the potential power output is reduced to the predetermined power or less from the battery 4, the available torque range of the motor generator MG is reduced so that there is a possibility that it becomes impossible for the motor/generator 5 to start the engine E hereinafter. Therefore, performing the engine start by the second starting mode is initiated. Note that, in FIG. 6, a solid line indicate a case in which the output of the battery 4 is 50 kw, a dotted line b shows a case where the output of the battery 4 is 50 kw, and a dashed line c shows a case where the output of the battery 4 is 60 kw, respectively.

(7) Performing the start of the engine E in the second starting mode when the battery SOC falls below a predetermined value (less than 35%, for example). For example, when the vehicle is traveling in EV mode for a long time due to traffic congestion or the like, it is intended to charge the battery 4.

(8) Performing the start of the engine E in the second starting mode when the vehicle speed attains a predetermined speed or more set in advance (100 km/h or more, for example). This is intended to start the engine before the rotation of the motor/generator MG becomes to be a high rotation.

(9) Performing the start of the engine E in the second start mode when there is engine start request due to decrease in a negative pressure of a vacuum pump. This is intended to ensure a negative pressure by driving the engine E.

(10) Performing the start of the engine E in the second start mode when predetermined idle stop prohibition conditions exist during the idle stop when performing a so-called idle stop at the intersection or the like.

(11) Performing the start of the engine E in the second starting mode when the battery SOC of the battery 9 reaches a predetermined value or more set in advance (65% or more, for example) during driving a downhill road. This is intended to take advantage of engine braking during downhill travel before the regenerative torque is limited due to the battery 4 being fully charged.

Incidentally, these conditions listed in (1) to (11) set examples of engine start requirement conditions to be determined in the second starting mode. The engine start-up requirement conditions are not intended to be limited to this condition (11).

Since in the case of starting the engine as the result of the accelerator operation by the driver, since an intention of engine start is present, the driver is likely to feel uncomfortable when the time is longer from the accelerator pedal operation to engine start rather than due to the torque variation caused by the engagement of the first clutch CL1. That is, when starting the engine as a result of the accelerator operation of the driver, it is preferable to variably control the torque transfer capacity of the first clutch CL1 so as to start the engine immediately.

On the other hand, since in the case of the engine starting by a factor or cause other than the accelerator operation by the driver, the driver himself or herself has no intention to start the engine. Thus, the driver is likely to feel a sense of discomfort due to the torque fluctuation associated with engagement of the first clutch CL1 rather than the time until the engine start. Thus, when the engine starts in response to the factors other than the accelerator operation of the driver, it is desirable to variably control the torque transfer capacity of the first clutch CL1 so as to suppress the torque fluctuation associated with engagement of the first clutch CL1.

Thus, in the first embodiment, when controlling variably the torque transfer capacity of the first clutch CL1 at the engine start-up, the transfer torque capacity is controlled to be set lower in the second start-up mode than in the first start-up mode. Therefore, in the second start-up mode, it is possible to suppress the shock due to the torque fluctuation accompanied by engagement of the first clutch CL1. That is, it is possible to suppress the torque fluctuation due to the first clutch engagement at the engine start-up operation not initiated by the drive so that it is possible during the engine startup to suppress to give discomfort to the driver caused by shock due to the torque fluctuations.

Figure 9:
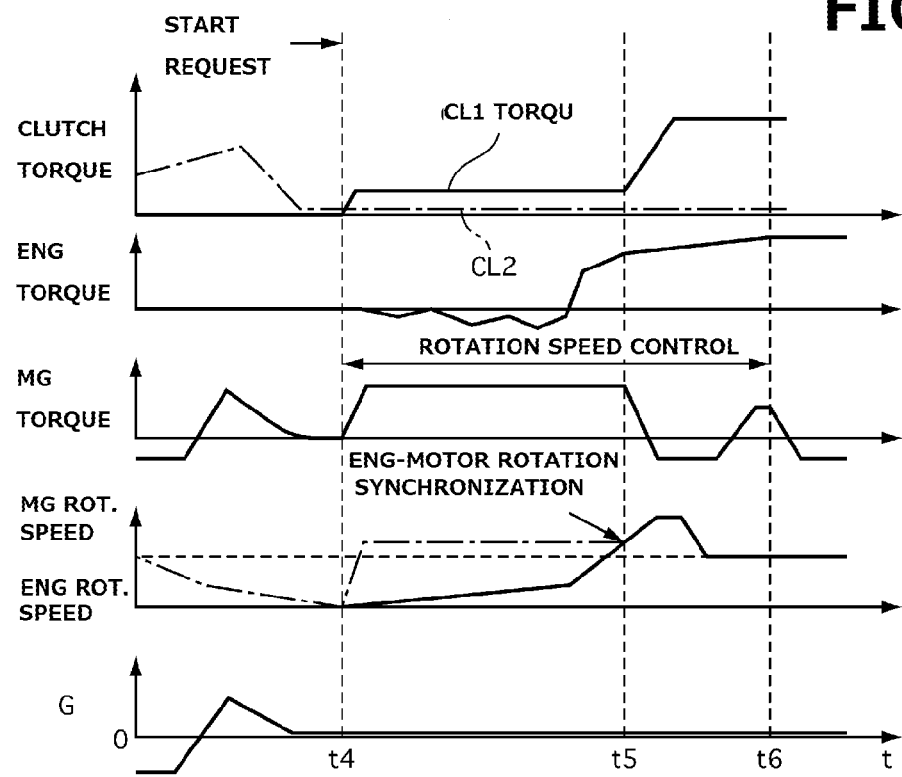
FIG. 9 is a timing chart showing a process for the engine start control by the second start mode in the first embodiment.

FIG. 9 is a timing chart showing a process for an engine start control in the second start mode in the first embodiment. At time t4, when there is an engine start request, since the target torque transfer capacity of the second clutch CL2 is determined according to the required driving torque, it is reduced to zero in this case, while the target torque transfer capacity of the first clutch CL1 is increased from zero to a target value during cranking operation. Then, at time t5, upon the motor generator rotational speed and the engine speed being synchronized, the target torque transfer capacity of the first clutch CL1 is increased towards the value that corresponds to a completely engaged state, while the target torque transfer capacity of the second clutch CL2 is held to remain zero due to the vehicle stop being continuing.

Incidentally, the motor/generator MG is controlled by its rotational speed such that an actual rotation speed becomes a target rotation speed upon the engine cranking being started at the time t4. The speed control is carried out up to the time t6 from time t4. Here, after time t6, the torque of the motor/generator MG is controlled so that the required driving torque is attained. Note that the transmission torque capacity of the first clutch CL1 during cranking in the second start-up mode is set to be lower than in the first start-up mode. Therefore, the cranking time in the second start mode is longer than a cranking time in the first start-up mode, whereas torque fluctuation is smaller.

Here, a case is assumed in which the driver depresses the brake pedal for braking operation. As discussed above, when one of the predetermined conditions above (1) to (11) is satisfied, the engine start is performed by the second start mode. During traveling in EV mode, upon the driver depressing the brake pedal, the regeneration torque is generated in motor generator MG to reproduce the coast torque at a predetermined vehicle speed or more. In this state, when the vehicle speed decreases gradually and becomes less than a predetermined speed, then the regenerative torque is reduced and braking force corresponding to the brake pedal operation of the driver is caused to be achieved by the frictional braking force of the brake unit 900 instead.

Thereafter, the motor generator MG generates the creep torque in order to reproduce the running state of the normal engine equipped vehicle. That is, the torque that the motor/generator MG generates is switched to the driving torque on the positive side from the regenerative torque on the negative side. Thus, it is possible to obtain a creep torque in the same manner as a normal engine vehicle, so that, for example, the driver can put the vehicle into garage or achieve the slow running state only by the operation of the brake pedal.

Here, in a state in which a creep torque is being generated by the motor/generator MG, assuming that a second start-up mode is requested and the engine would be caused to start, an engine would start with the creep torque being generated. In this case, since the transfer torque capacity of the second clutch CL2 is secured so as to transfer the creep torque, the driver is likely to feel uncomfortable due to torque fluctuation. Here, when it is determined that the vehicle decelerates to a certain extent and the vehicle is held being stopped, even prior to a complete stop, then the creep torque is triggered to decrease. However, if the engine start is initiated or triggered at the time of start of decrease in creep torque, the engine will be started at a high creep torque state with a high transfer torque capacity of the second clutch CL2 so that the driver has a tendency to encounter a high discomfort.

Figure 7:
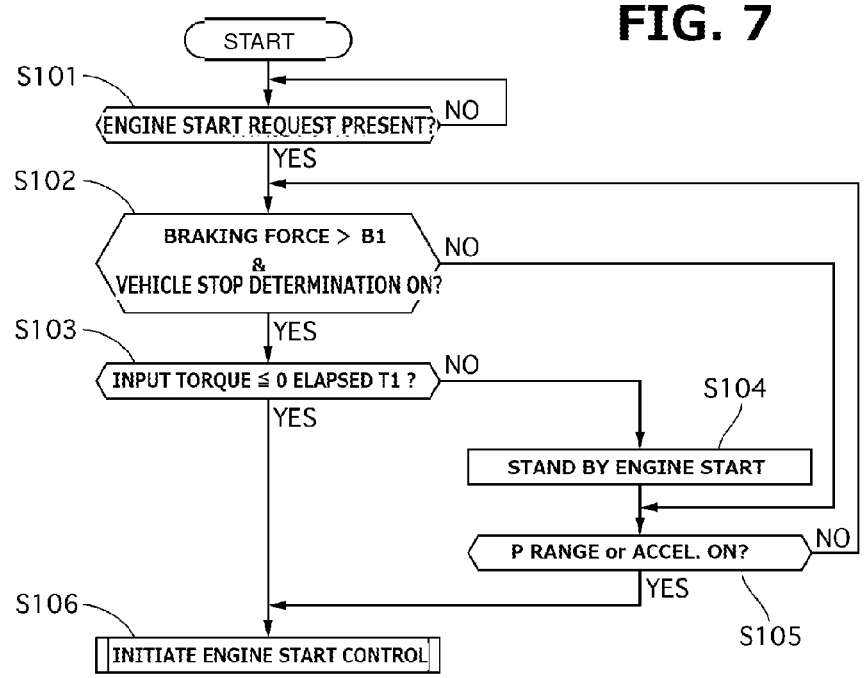
FIG. 7 is a flowchart showing an engine start control process according to a second start mode in the first embodiment.

Thus, in the first embodiment, instead of using a vehicle speed as a trigger, the engine is allowed to start only after the torque the motor/generator MG is generating has become smaller than a sufficiently small predetermined value. FIG. 7 shows a flowchart illustrating an engine start control process in the second start-up mode in the first embodiment.

In step S101, it is determined whether or not there is an engine start request in the second starting mode, the process proceeds to step S102 when there is the engine start request, and repeats this step otherwise.

In step S102, it is determined whether or not the braking force is greater than the predetermined braking force B1 and whether or not a stop determination is ON. When these conditions are satisfied, the process proceeds to step S103, whereas the process proceeds to step S105 otherwise. Here, the stop determination is made that the vehicle has approached a substantially stopped state by confirming that the state has continued for a predetermined time or more in which the vehicle speed becomes a predetermined value or less. Therefore, the vehicle is not necessarily in a complete stop. Further, instead of the wheel speed sensor or the like, the vehicle speed is detected by resolver 13 for detecting the motor/generator rotation speed. This is because the resolution is extremely high with the resolver 13 as compared with the wheel speed sensors so that the resolvers 13 may detect a vehicle speed accurately even in the low vehicle speed region. In a motor/generator control process, upon this stop determination being ON, the creep torque imparted to the motor/generator MG will be controlled to decrease gradually toward zero Nm. When a braking force, i.e., a frictional braking force by the brake unit 900 is greater than a predetermined braking force B1, then it is considered that the driver has an intention to brake and the toque fluctuations acting on the wheel may be suppressed to some extent.

In step S103, it is determined whether a state has passed for a predetermined time T1 or more in which the absolute value of the input torque (i.e., the output torque of the motor/generator MG) is zero or less. When the predetermined time T1 has elapsed, the process proceeds to step S106, while the process proceeds to step S104 otherwise. It is considered that application of creep torque is fully completed and it is possible to suppress the torque variation due to engine start.

Here, in the first embodiment, the input torque is determined by using a torque command or request to the motor/generator MG. It is also possible to estimate the torque based on the current value supplied to the motor/generator MG, or, alternatively, the input torque may be detected by using a torque sensor and the like.

In step S104, the engine is caused to stand by for start. Specifically, even when any one of the above conditions (1) to (11) is satisfied and thereby an engine start request is confirmed, engine will be inhibited from starting. Thus, if there is a risk of torque fluctuation, by avoiding the engine start, it is possible to avoid the discomfort to the driver.

In step S105, it is determined whether shift position is in a P range, or the accelerator pedal is in an ON position. When these conditions are met, control proceeds to step S106, otherwise control returns to step S102. When the shift position is in a P-range, the wheel is compulsorily locked by the operation of the parking lock mechanism, the influence of the torque fluctuations may be suppressed even upon generation of the input torque. Further, when the accelerator pedal has been turned ON, since there is a starting intention by the driver, it is now appropriate to start the engine in the first start-up mode.

In step S106, the engine start-up control process is initiated. Note that the engine start-up control process is executed in accordance with the process described in FIG. 9 described above.

Figure 8:
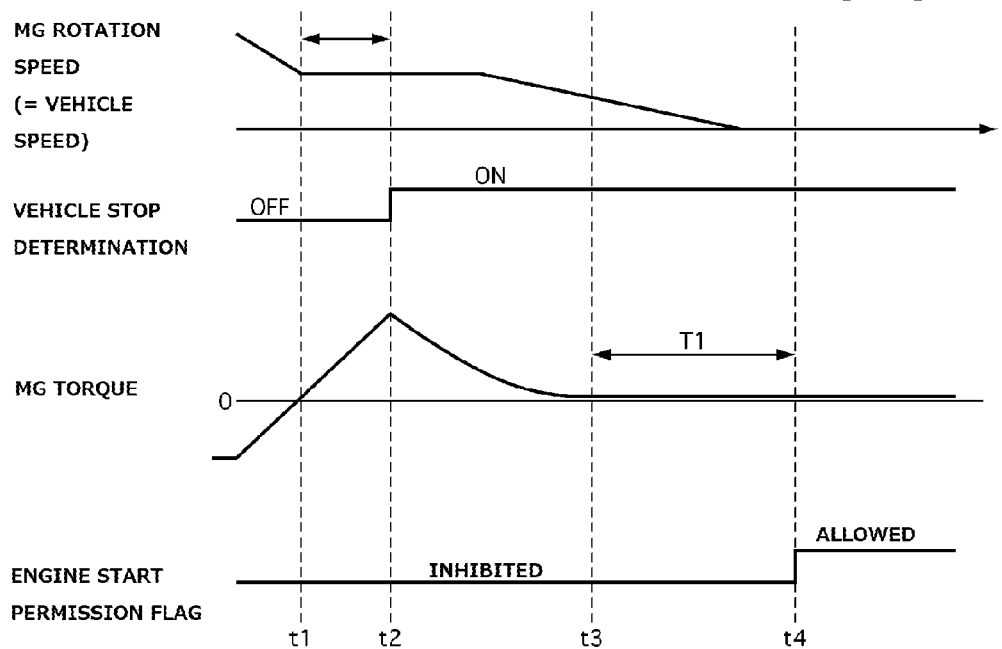
FIG. 8 is a timing chart showing a process for determining an engine start control by the second start mode in the first embodiment.

FIG. 8 is a time chart showing a process for determining to start an engine start control by the second start-up mode in the first embodiment. The first running state in the time chart relates to a state in which the vehicle decelerates to a predetermined vehicle speed during deceleration caused by the depression on the brake by the diver. Also, in this state, in accordance with decrease in vehicle speed, a regenerative torque output state of the motor/generator MG decreases the regenerative torque and thus transfers gradually to the frictional braking force by the brake control unit 900. The decrease in regenerative torque is carried out to reduce the regenerative torque control to zero when a predetermined vehicle speed is available. Note that the engine start request in the second start mode has been made already, At time t1, upon the regenerative torque being equal to zero, a timer for vehicle stop determination is started to count. Note that, in this state, the vehicle speed has fallen to a predetermined vehicle speed. The timer for the vehicle stop determination is caused to count up continuously when the vehicle speed continues to be lower than the predetermined vehicle speed and is reset when the vehicle speed is increased upon increase in vehicle speed. At the same time of counting-up of the time for vehicle stop determination, the motor/generator MG starts to generate a creep torque and increases the torque gradually.

At time t2, when the count value in the timer for vehicle stop determination has elapsed a predetermined time, it is determined that the vehicle speed has sufficiently decreased and set the timer for vehicle stop determination ON. As a result, the motor/generator MG reduces the torque gradually until it reaches zero torque from the state in which the creep torque is being output. Incidentally, once an engine start would be allowed in the second start mode at this timing temporarily, the first clutch CL1 will be engaged with the creep torque being generated. When the creep torque is being generated, the second clutch CL2 also has a transfer torque capacity so that, even if control is made to add torque to be absorbed by the first clutch CL1, it is difficult to obtain a stable torque of the motor/generator due to variations in the transfer torque capacity of the first clutch CL1 and variations in the engine cranking torque.

Further, a feedback control is inevitable when controlling the torque to be transmitted to the side of the second CL2 so that fluctuation occurs in the torque output from the motor/generator MG. Further, even if the slip control of the second clutch CL2 is performed, there is also a possibility that the slip amount varies due to the input side rotation speed fluctuation. In this case, the driver might feel uncomfortable because of the fluctuations in torque transmitted to drive wheel due to occurrence of fluctuations in friction coefficient.

Thus, in the first embodiment, it is configured not to allow the engine from being started in a state in which the motor/generator MG is producing a torque (i.e., the state in which the second clutch CL2 has a transmission torque capacity).

At time t3, when the creep torque output of the motor generator MG becomes zero Nm, counting-up of the timer will be started. At this time, the torque transfer capacity of the second clutch CL2 is also set to 0 Nm. When it is determined at time t4, the count value of the timer has elapsed a specified time T1 previously set, the engine start permission flag is turned ON. At this time, because of a state in which the vehicle speed drops sufficiently vehicle with the brake pedals being depressed, the stable vehicle stop state is ensured. Accordingly, even when the motor/generator torque is output for an engine start-up operation, since torque is used only for the engine start-up, the driver may start the engine without encountering an uncomfortable feeling.

As described above, in the hybrid vehicle in the first embodiment, it is possible to obtain the operational effects listed below.

(1) In a control system for a hybrid vehicle having a second clutch CL2 which is arranged between a motor/generator and a drive wheel and an integrated controller 10 (engine start control means) that engages the second clutch CL2 in response to an engine start request to perform an engine start by the motor/generator MG, in step S103, when the engine start request is present in the second startup mode and the absolute value of the motor/generator MG output torque assumes a predetermined value or less, the engine cranking is permitted. Therefore, the torque fluctuations associated with engine start may be suppressed. Further, the discomfort felt by the drivers may be suppressed.

(2) The predetermined value is zero, and in step S103, the engine cranking is allowed after a predetermined, specified time set in advance elapses after the motor/generator torque has gone to zero. That is, it is possible to exclude the extremely low speed driving conditions due to the inertial force of the vehicle by waiting for elapse of the predetermined time so that the discomfort to the driver may be alleviated. Also, the influences attributable to the state change in road surface or braking fluctuations by the driver's operation may also be eliminated.

(3) By providing a resolver 13 (vehicle speed detecting means) to detect a vehicle speed as well as a step S102 (vehicle stop determination means) for determining based on the detected vehicle speed whether or not the vehicle has come to stop, in step S102, the engine cranking will be allowed after the determination of vehicle stop. Therefore, it is possible to detect the vehicle condition accurately compared with the case where determination is made only by a motor/generator torque and a frictional braking force so that the torque fluctuations associated with engine startup may be reliably suppressed. Assuming the determination based the motor/generator torque and frictional braking force only, a vehicle stop determination would be falsely determined at high frictional braking force when the creep torque remains. In this case, the driver will be given a discomfort due to the torque variations associated with engine startup.

(4) The vehicle speed detection means detects a vehicle speed based on a resolver 13 (rotational angle sensor) for detecting the rotation speed of the motor/generator. Therefore, because such a sensor is used with an extremely high resolution compared to a vehicle speed sensor and the like, the vehicle stop state may be detected accurately at an extremely low vehicle speed.

The present invention has been described based on the first embodiment. However, the specific configuration may be other configurations.

In the first embodiment, the engine start permission condition is satisfied when the stat of the motor/generator has continued for a predetermined time or more in which the output thereof is zero. However, if the braking force is equal to or more than a value obtained by adding a predetermined value to the motor/generator torque, the engine start may be permitted. When the driving wheel is securely stopped and the motor/generator torque is small, the driver is less likely to feel uncomfortable even when torque fluctuations would occur.

In the first embodiment, description has been given about a hybrid vehicle of FR type. This may be a hybrid vehicle of FF type.

The invention claimed is:

1. A control system for a hybrid vehicle having a clutch arranged between a motor/generator and a drive wheel comprising: a controller configured to: determine if an engine start request is a first start up mode, where the engine start request is due to an accelerator pedal operation, or a second start up mode, wherein the engine start request is due to a vehicle parameter other than the accelerator pedal operation; if the first start up mode is determined, variably control a torque transfer capacity of an engine clutch to start the engine immediately in response to the accelerator pedal operation; if the second start up mode is determined: determine if a braking force is greater than a predetermined braking force and if the vehicle stop determination is on; if the braking force is greater than the predetermined braking force and the vehicle stop determination is on, determine when an absolute value of a motor/generator output torque assumes a predetermined value or less, prevent an engine start for a predetermined time from when the motor/generator output torque has reached the predetermined value or less; and allow the engine start when the predetermined time has elapsed; and if the braking force is less than or equal to the predetermined braking force and the vehicle stop determination is off, determine if a shift position is park or an accelerator pedal is in an on position; if the shift position is park or the accelerator pedal is on, allow the engine start when the predetermined time has elapsed; and if the shift position is not park and the accelerator pedal is off, redetermined if the braking force is greater than the predetermined braking force and if the vehicle stop determination is on.

2. The control system for a hybrid vehicle according to claim 1, wherein the predetermined value is zero.

3. The control system for a hybrid vehicle according to claim 1, further comprising:
a vehicle speed detector configured to detect a vehicle speed, wherein the stop determination is made on the basis of the vehicle speed detected, wherein the controller is configured to allow the engine start if the vehicle is determined to be stopped.

4. The control system for a hybrid vehicle according to claim 3, wherein the vehicle speed detector is configured to detect the vehicle speed based on a rotation angle sensor that detects the rotation speed of the motor/generator.

5. The control system for a hybrid vehicle according to claim 1, wherein the controller is further configured to:
allow the engine to start during the second start up mode if a shift position is in park or if the accelerator pedal is depressed.

6. The control system for a hybrid vehicle according to claim 1, wherein the vehicle parameter is an oil temperature of an automatic transmission.

7. The control system for a hybrid vehicle according to claim 1, wherein the vehicle parameter is a cooling water temperature of the engine.

8. The control system for a hybrid vehicle according to claim 1, wherein the vehicle parameter is a potential power output of a battery.

\* \* \* \* \*